US011892494B2

(12) United States Patent
Mlyniec et al.

(10) Patent No.: US 11,892,494 B2
(45) Date of Patent: Feb. 6, 2024

(54) METHODS FOR VERIFYING DIGITAL-ELECTRICITY LINE INTEGRITY

(71) Applicant: VoltServer, Inc., East Greenwich, RI (US)

(72) Inventors: Stanley Mlyniec, Coventry, RI (US); Jonathan J. Casey, Warwick, RI (US); Stephen S. Eaves, Charlestown, RI (US)

(73) Assignee: VoltServer, Inc., East Greenwich, RI (US)

( * ) Notice: Subject to any disclaimer, the term of this patent is extended or adjusted under 35 U.S.C. 154(b) by 467 days.

(21) Appl. No.: 15/963,582

(22) Filed: Apr. 26, 2018

(65) Prior Publication Data

US 2018/0313886 A1    Nov. 1, 2018

Related U.S. Application Data

(60) Provisional application No. 62/490,389, filed on Apr. 26, 2017.

(51) Int. Cl.
*G01R 31/08* (2020.01)
*H04B 3/54* (2006.01)

(52) U.S. Cl.
CPC ......... *G01R 31/088* (2013.01); *G01R 31/085* (2013.01); *G01R 31/086* (2013.01); *H04B 3/542* (2013.01)

(58) Field of Classification Search
CPC .. G01R 31/088; G01R 31/085; G01R 31/086; H04B 3/542

(Continued)

(56) References Cited

U.S. PATENT DOCUMENTS 3,443,247 A * 5/1969 Fjerstad .................. H03C 3/08
                                                            332/131
4,580,104 A    4/1986 Lue
                   (Continued)

FOREIGN PATENT DOCUMENTS

EP    0819947 A2    1/1998
EP    2482085 A1    8/2012
        (Continued)

OTHER PUBLICATIONS

Zhang and et al, "Dead-time compensation of inverters considering snubber and parasitic capacitance." IEEE Transactions on Power Electronics 29, No. 6 (2013): 3179-3187 (Year: 2013).*

(Continued)

*Primary Examiner* — Douglas Kay
(74) *Attorney, Agent, or Firm* — Modern Times Legal; Robert J. Sayre (57) ABSTRACT

The integrity of transmission-line voltage measurements in a digital-electricity power system in the presence of line-voltage disturbances during a sample period is ensured via detection or prevention by (a) acquiring at least three measurements of transmission-line voltage, performing numerical analysis on the measurements to produce a polynomial function, and estimating accuracy of the polynomial function based on magnitude of variance of the individual measurements; (b) applying a negative or positive bias to the transmission line during the sample period and acquiring voltage measurements to determine a rate of voltage change with the bias applied; (c) shifting a start time of a first sample period on a first transmission line in reference to a second sample period on a second transmission line to reduce overlap of sample periods across both transmission lines; and/or (d) synchronizing start times of respective sample periods on first and second transmission lines.

12 Claims, 7 Drawing Sheets

(58) Field of Classification Search
USPC .......................................................... 702/58
See application file for complete search history.

(56) References Cited

U.S. PATENT DOCUMENTS

| | | | |
|---|---|---|---|
| 5,465,287 A | 11/1995 | Egozi | |
| 5,990,686 A * | 11/1999 | Vokey | G01R 31/088 |
| | | | 324/509 |
| 6,618,648 B1 * | 9/2003 | Shirota | H02H 7/263 |
| | | | 700/286 |
| 2005/0213684 A1 * | 9/2005 | Flake | G01R 31/088 |
| | | | 375/295 |
| 2006/0289312 A1 | 12/2006 | Tremblay et al. | |
| 2009/0204268 A1 | 8/2009 | Eaves | |
| 2012/0075759 A1 | 3/2012 | Eaves | |
| 2013/0096854 A1 * | 4/2013 | Schweitzer, III | G01R 31/085 |
| | | | 702/59 |
| 2013/0103220 A1 * | 4/2013 | Eaves | H02J 3/12 |
| | | | 700/293 |
| 2014/0324506 A1 * | 10/2014 | Garrity | G06Q 10/1097 |
| | | | 705/7.21 |
| 2015/0207318 A1 * | 7/2015 | Lowe | H02J 13/0003 |
| | | | 307/24 |
| 2015/0214836 A1 | 7/2015 | Tsumura | |
| 2015/0215001 A1 * | 7/2015 | Eaves | H04L 1/0033 |
| | | | 375/224 |
| 2015/0346266 A1 * | 12/2015 | Dimino | G01R 31/50 |
| | | | 702/59 |
| 2016/0111877 A1 * | 4/2016 | Eaves | H02J 1/14 |
| | | | 375/257 |
| 2016/0134331 A1 | 5/2016 | Eaves | |
| 2017/0192047 A1 * | 7/2017 | Qi | G01R 31/088 |
| 2017/0214236 A1 | 7/2017 | Eaves | |
| 2017/0229886 A1 | 8/2017 | Eaves | |
| 2018/0275188 A1 * | 9/2018 | Dzienis | G01R 31/085 |

FOREIGN PATENT DOCUMENTS

| | | |
|---|---|---|
| JP | H 1153081 A | 2/1999 |
| JP | H 11234104 A | 8/1999 |

OTHER PUBLICATIONS

Mann, Barry J., and I. F. Morrison. "Digital calculation of impedance for transmission line protection." IEEE Transactions on Power Apparatus and Systems 1 (1971): 270-279 (Year: 1971).*

Leeds, W. M., and R. C. Van Sickle. "The interruption of charging current at high voltage." Transactions of the American Institute of Electrical Engineers 66, No. 1 (1947): 373-382 (Year: 1947).*

Ma, Qiyan, Bin Zheng, Liangeng Ban, and Zutao Xiang. "Secondary arc current analysis of an untransposed EHV/UHV transmission line with controllable unbalanced shunt reactor." IEEE Transactions on Power Delivery 30, No. 3 (2015): 1458-1466 (Year: 2015).*

USPTO, International Search Report and Written Opinion for PCT App. No. US18/29578 (dated Jul. 27, 2018) (corresponding PCT application).

* cited by examiner

METHODS FOR VERIFYING DIGITAL-ELECTRICITY LINE INTEGRITY

RELATED APPLICATION

This application claims the benefit of U.S. Provisional Application No. 62/490,389, filed 26 Apr. 2017, the entire content of which is incorporated herein by reference.

BACKGROUND

Digital electric power, or digital electricity, can be characterized as any power format where electrical power is distributed in discrete, controllable units of energy. Packet energy transfer (PET) is a new type of digital electric power protocol disclosed in U.S. Pat. No. 8,068,937, U.S. Pat. No. 8,781,637 (Eaves 2012) and international patent application PCT/US2017/016870, filed 7 Feb. 2017.

The primary discerning factor in a digital power transmission system compared to traditional, analog power systems is that the electrical energy is separated into discrete units; and individual units of energy can be associated with analog and/or digital information that can be used for the purposes of optimizing safety, efficiency, resiliency, control or routing. Since the energy in a PET system is transferred as discrete quantities, or quanta, it can be referred to as "digital power" or "digital electricity".

As described in Eaves 2012, a source controller and a load controller are connected by power transmission lines. The source controller of Eaves 2012 periodically isolates (disconnects) the power transmission lines from the power source and analyzes, at a minimum, the voltage characteristics present at the source controller terminals directly before and after the lines are isolated. The time period when the power lines are isolated was referred to by Eaves 2012 as the "sample period", and the time period when the source is connected is referred to as the "transfer period". The rate of rise and decay of the voltage on the lines before, during and after the sample period reveal if a fault condition is present on the power transmission lines. Measurable faults include, but are not limited to, short circuits, high line resistance or the presence of an individual who has improperly come in contact with the lines.

Eaves 2012 also describes digital information that may be sent between the source and load controllers over the power transmission lines to further enhance safety or provide general characteristics of the energy transfer, such as total energy or the voltage at the load controller terminals. One method for communications on the same digital-power transmission lines as used for power was further described and refined in U.S. Pat. No. 9,184,795 (Eaves Communication Patent).

One application of a digital-power distribution system is to safely distribute direct-current (DC) power in digital format and at elevated voltage from the source side of the system to the load side.

U.S. Pub. Pat Application No. 2016/0134331 A1 (Eaves Power Elements) describes the packaging of the source side components of Eaves 2012, in various configurations, into a device referred to as a digital power transmitter.

U.S. Pat. No. 9,419,436 (Eaves Receiver Patent) describes the packaging of various configurations of the load side components of Eaves 2012 into a device referred to as a digital power receiver.

SUMMARY

The methods described, below, build on the earlier work of Eaves 2012 by focusing on novel methods to minimize errors in the detection of a fault on the transmission lines. Such errors can be caused by electrical noise or other disturbances that can affect the integrity of the data being sensed from the transmission lines when executing the packet energy transfer protocol.

Digital electric power, or digital electricity, can be characterized as any power format where electrical power is distributed in discrete, controllable units of energy. A digital electricity system periodically isolates an electrical transmission line from both the source and load to analyze analog line characteristics that reflect a possible fault or human contact with the transmission wiring. The detection of line faults involves periodic measurement of transmission-line voltage. However, practical transmission-line voltage measurements often are influenced by electrical noise or unwanted oscillation. The disclosed methods can be used to ensure the integrity of the analog measurements used for fault detection, thus preventing falsely positive or falsely negative line-fault determinations.

Methods for ensuring the integrity of the data used in determining transmission-line faults while executing packet energy transfer are described herein, where various embodiments of the methods and apparatus for performing the method may include some or all of the elements, features and steps described below.

In embodiments of the method for ensuring the integrity of transmission-line voltage measurements in a digital-electricity power system comprising one or more transmitters, voltage on one or more of the transmission lines is monitored and controlled with a respective transmitter. The integrity of transmission-line voltage measurements in the presence of line-voltage disturbances during a sample period is ensured by employing at least one of the following four methods.

In a first method, at least three measurements of transmission-line voltage are acquired during the sample period where voltage measurements may be affected by electrical disturbances. Numerical analysis is performed on the measurements to produce a polynomial function that approximates disturbance-free transmission-line voltage measurements. The accuracy of the polynomial function is estimated based on the magnitude of variance of the individual measurements from the approximation, and the transmission-line power is interrupted if the estimated accuracy does not meet a minimum accuracy requirement.

In a second method, a negative or positive bias is applied to the transmission line during the sample period. Voltage measurements are acquired to determine a rate of voltage change with the bias applied; and power to the transmission line is interrupted if the rate of voltage change is outside of predetermined minimum and maximum values.

In a third method, where the digital-electricity power system comprises at least a first and a second transmission line, a start time of a first sample period on the first transmission line is shifted in reference to a second sample period on the second transmission line to reduce overlap of sample periods across both transmission lines to prevent induction of electromagnetic noise from one transmission line to another transmission line.

In a fourth method, where the digital-electricity power system comprises at least a first and a second transmission line, a start time of a first sample period on the first transmission line is synchronized with a start time of a sample period on the second transmission line to allow electromagnetic noise from both transmission lines to decay to an acceptable value before the end of the sample period, thus leaving at least part of the remaining sample period available for disturbance-free voltage measurement.

In executing the packet energy transfer (PET) protocol inherent to digital electricity, a portion of the total energy packet period is allocated for the transfer of energy from the source to the load. This portion is referred to as the transfer period. The remaining time in the packet period is allocated for detecting faults and transferring data. This portion of the packet is referred to as the sample period. In one embodiment, the controller on the source side of the system monitors the decay in transmission line voltage during the sample period. A change in the rate of decay can indicate a variety of fault conditions, including a short circuit or human contact with the transmission-line conductors.

There are a number of practical considerations related to ensuring the integrity of fault detection within the PET protocol. The first consideration is obtaining valid measurements of transmission-line voltage during the sample period when there are oscillations on the transmission lines due to "reflected waves". Reflected waves occur when a pulse of electrical current travels to the end of the line and is reflected back to the original location. The reflections will appear as voltage oscillations when observed at any point in the transmission line. The oscillations can cause errors in the determination of the decay rate of the line voltage during the PET sample period.

A second consideration is excessive line-to-line capacitance associated with long transmission lines. The capacitance can reach a level where it shrouds the effects of a decrease in line-to-line resistance.

A third consideration is the coupling of electromagnetic interference (EMI) to the transmission-line pairs. The interference can originate from other transmission-line pairs in close proximity, including other digital-electricity transmission-line pairs.

Methods described herein address these considerations through both prevention and detection.

From a prevention standpoint, multiple parallel transmission lines transmitting digital electricity are interleaved, meaning that the start of the energy packet in one transmission line is purposely shifted in time in relation to other transmission lines. Specifically, the sample periods of multiple energy packets are, as much as is practical, arranged so that they do not occur at the same time in transmission lines that are in close proximity. As will be described in more detail, below, transmission-line reflections produce oscillations that are a source of EMI; and the EMI can produce disturbances in adjacent transmission-line pairs. The line reflections are stimulated by the sudden decrease in line current caused by the start of the sample period. Adjacent transmission lines containing digital electricity are most susceptible to being disturbed by EMI if it occurs during the sample period because the transmission-line series impedance is much higher in this portion of the energy packet, meaning that EMI can be generated with less energy.

Two detection methods are described herein.

The first detection method uses a biasing circuit to drive the transmission-line pair to a desired voltage. The simplest form of a biasing circuit is a resistive voltage divider. By measuring the transmission-line voltage while the bias is applied over a known time period, a value indicative of the line-to-line impedance can be calculated. If the value is outside of predetermined acceptable values, a fault will be registered and power to the transmission lines will be interrupted. In addition to detecting a fault on the transmission lines, the measurement is also useful for detecting hardware problems, such as a short-circuit failure of a line-disconnect device. If the line-disconnect device is unsuccessful in interrupting current to the transmission line, the line voltage will not decay during the measurement period, indicating a damaged disconnect device or supporting circuitry.

Because the lines are being actively biased to a target voltage, the method can overcome some of the effects of EMI or high capacitance on the transmission lines. A tradeoff for using biasing versus simply opening the source-disconnect switch is that the biasing current can shroud the effects of a low current line-to-line fault on the transmission lines since the system must distinguish the difference between the fault current and bias current to properly register a fault.

The second detection method involves determining if the voltage being measured on the transmission lines during the sample period is too noisy to support a valid measurement. Referred to as anomaly detection, the method quantifies the deviation of the transmission-line voltage during the sample period from an ideal reference line. If the deviation exceeds a predetermined maximum, the measurement is considered invalid. After a predetermined number of invalid measurements, the line is considered to be in a faulted state and power to the transmission line will be interrupted.

In the accompanying drawings, like reference characters refer to the same or similar parts throughout the different views; and apostrophes are used to differentiate multiple instances of the same item or different embodiments of items sharing the same reference numeral. The drawings are not necessarily to scale; instead, an emphasis is placed upon illustrating particular principles in the exemplifications discussed below. For any drawings that include text (words, reference characters, and/or numbers), alternative versions of the drawings without the text are to be understood as being part of this disclosure; and formal replacement drawings without such text may be substituted therefor.

DETAILED DESCRIPTION

The foregoing and other features and advantages of various aspects of the invention(s) will be apparent from the following, more-particular description of various concepts and specific embodiments within the broader bounds of the invention(s). Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise defined, used or characterized herein, terms that are used herein (including technical and scientific terms) are to be interpreted as having a meaning that is consistent with their accepted meaning in the context of the relevant art and are not to be interpreted in an idealized or overly formal sense unless expressly so defined herein.

The terminology used herein is for the purpose of describing particular embodiments and is not intended to be limiting of exemplary embodiments. As used herein, singular forms, such as "a" and "an," are intended to include the plural forms as well, unless the context indicates otherwise. Additionally, the terms, "includes," "including," "comprises" and "comprising," specify the presence of the stated elements or steps but do not preclude the presence or addition of one or more other elements or steps.

Figure 1:
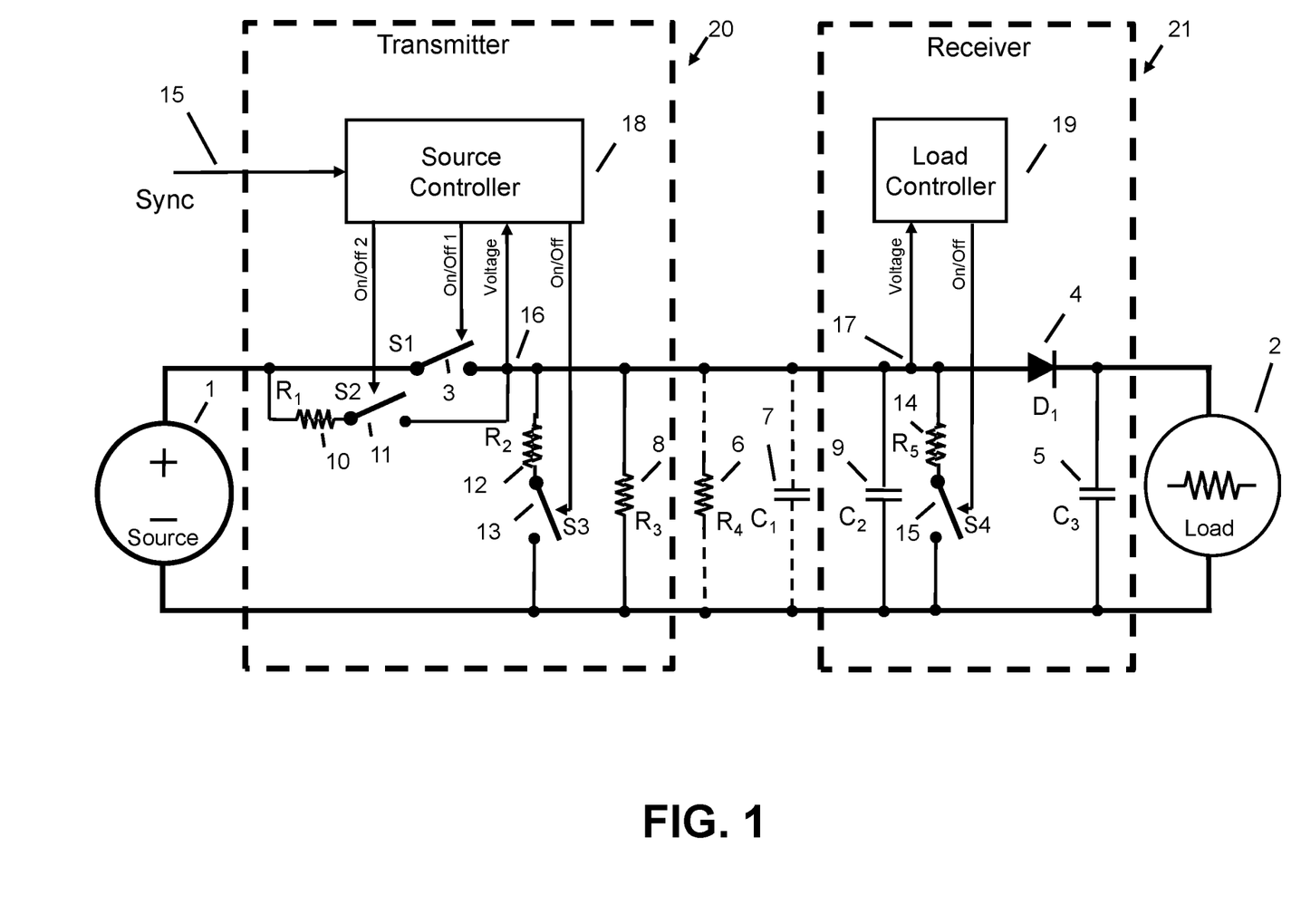
FIG. 1 is a block diagram of an embodiment of the safe power-distribution system.

A representative digital-power system, as originally described in Eaves 2012, is shown in FIG. 1. The system comprises a source 1 and at least one load 2. The PET protocol is initiated by an operating switch 3 to periodically disconnect the source from the power transmission lines. When the switch is in an open (non-conducting) state, the lines are also isolated by isolation diode ($D_1$) 4 from any stored energy that may reside at the load 2.

Eaves 2012 offered several versions of alternative switches that can replace $D_1$, and all versions can produce similar results when used in the presently described methods. Capacitor ($C_3$) 5 is representative of an energy-storage element on the load side of the circuit.

The transmission lines have inherent line-to-line resistance ($R_4$) 6 and capacitance ($C_1$) 7. The PET system architecture, as described by Eaves 2012, adds additional line-to-line resistance ($R_3$) 8 and capacitance ($C_2$) 9. At the instant switch 3 is opened, $C_1$ and $C_2$ have stored charge that decays at a rate that is inversely proportional to the additive values of $R_4$ and $R_3$. Capacitor ($C_3$) 5 does not discharge through $R_3$ and $R_4$ due to the reverse-blocking action of isolation diode ($D_1$) 4. The amount of charge contained in capacitors ($C_1$ and $C_2$) is proportional to the voltage across them and can be measured at points 16 and 17 by a source controller 18 or load controller 19.

Figure 2:
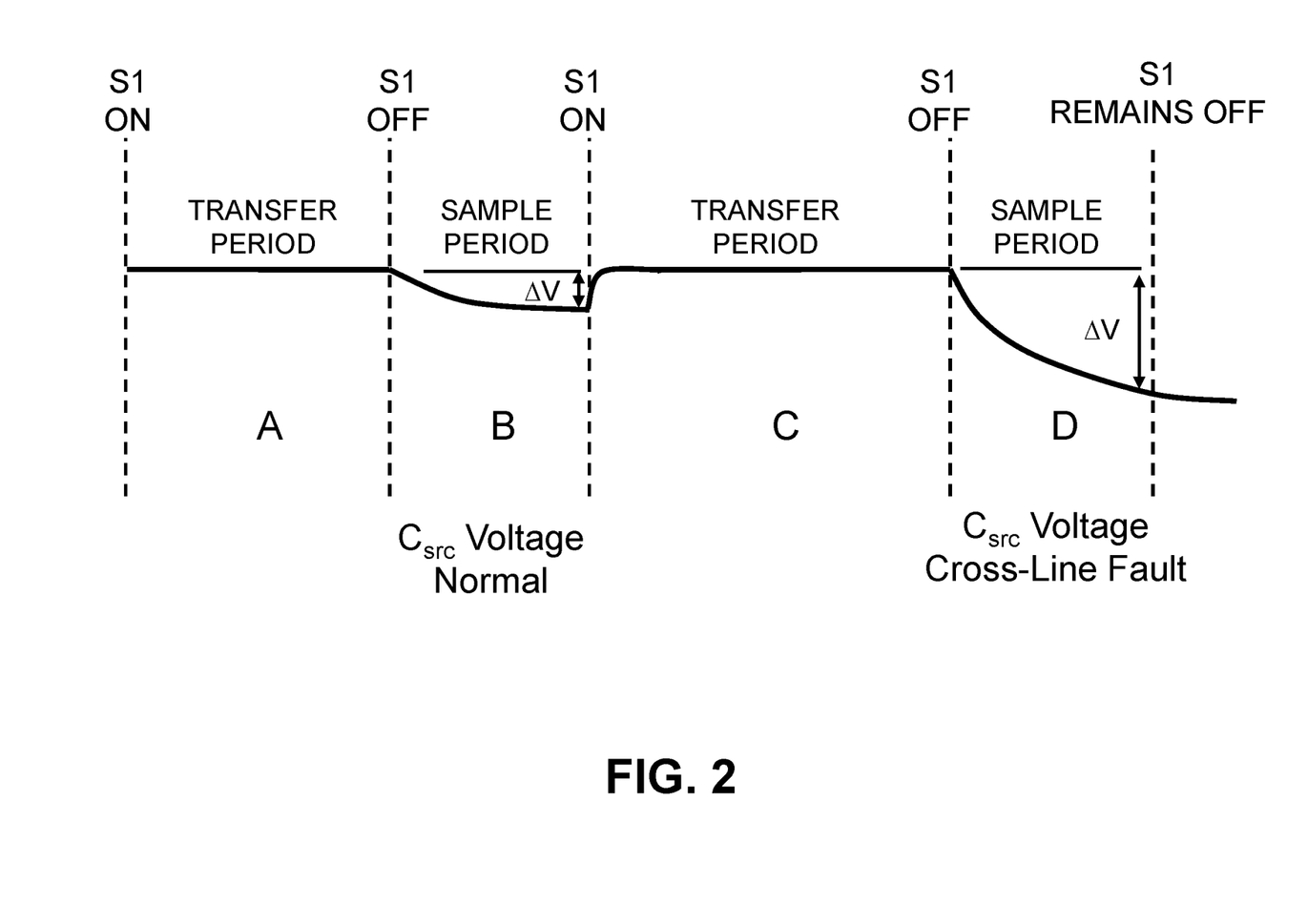
FIG. 2 is an illustration of a packet-energy-transfer voltage (PET voltage) waveform.

As described in Eaves 2012, a change in the rate of decay of the energy stored in $C_1$ and $C_2$ can indicate that there is a cross-line fault on the transmission lines. The difference between normal operation and a fault, as presented by Eaves 2012, is illustrated in FIG. 2.

Referring again to FIG. 1, the combination of switch (S1) 3; source controller 18; resistor ($R_1$) 10; switch (S2) 11; and resistor ($R_3$) 8 can be referred to as a transmitter 20. The combination of switch (S4) 15; resistor ($R_5$) 14; load controller 19; diode ($D_1$) 4; capacitor ($C_2$) 9; and capacitor ($C_3$) 5 can be referred to as a receiver 21.

Figure 3:
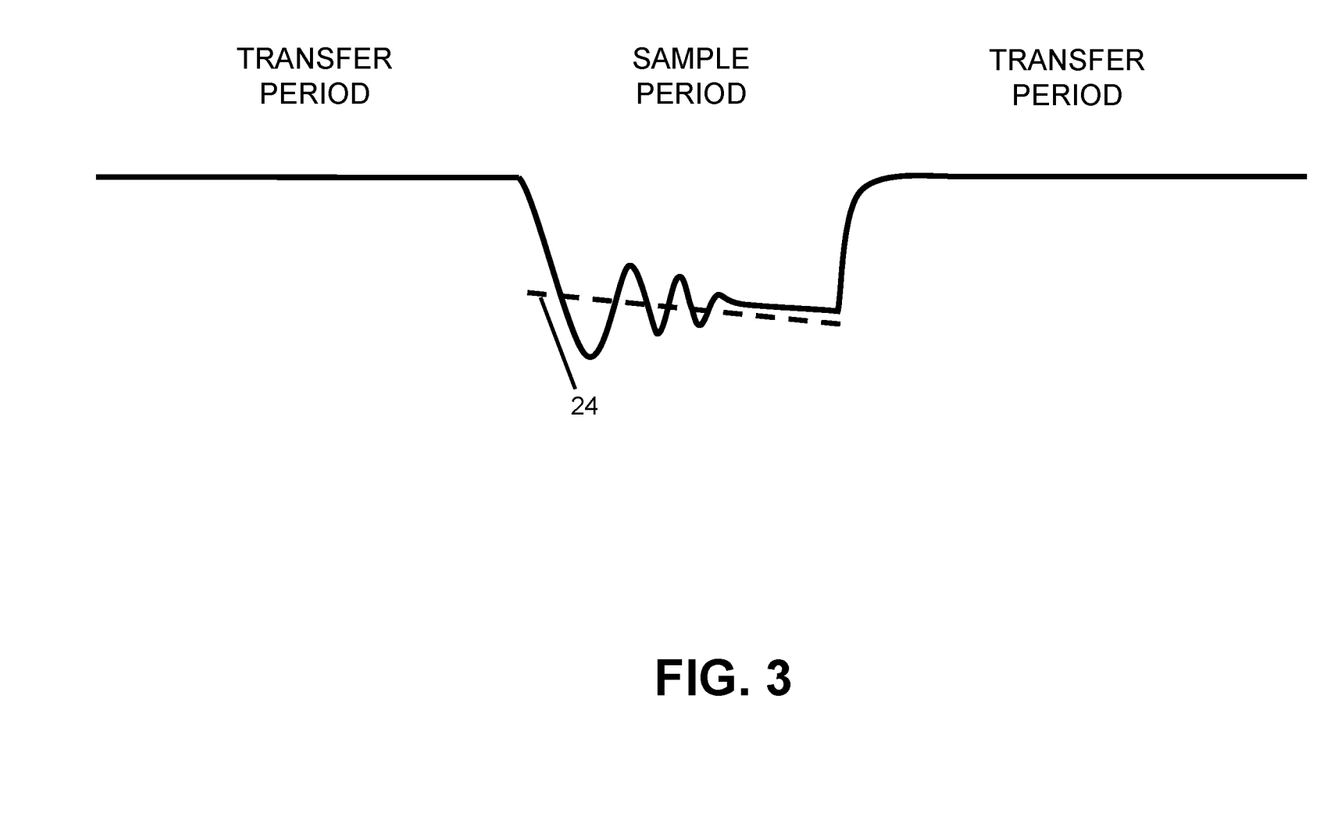
FIG. 3 illustrates the effect of line oscillations on the PET voltage waveform.

FIG. 3 illustrates a first practical consideration when performing PET-oscillation in the transmission line voltage due to reflections or EMI. The oscillation affects the integrity of fault detection, raising the difficulty of extracting the rate of voltage decay due to the normal depletion of energy in the line capacitance from the disturbances caused by the oscillations. Since the abnormal-decay transmission-line voltage during the sample period indicates a transmission fault, the oscillation can produce either a false positive or false negative test result. When the amplitude of the oscillation is small, analog or digital filtering can improve the measurement; but if the oscillation is large, the analog measurements become unusable.

The oscillations shown in FIG. 3 can originate from electromagnetic interference external to the transmission lines or from other transmission-line pairs in close proximity, including other digital-electricity transmission-line pairs. In particular, longer transmission lines are subject to "reflected waves," where a pulse of electrical current will travel to the end of the line and then reflect back to the original location. The reflections will appear as voltage oscillations when observed at any point in the transmission line. The electromagnetic emissions from transmission-line reflections in closely adjacent digital-electricity line pairs can exacerbate the oscillations. Adjacent transmission lines containing digital electricity are most susceptible to being disturbed by EMI if it occurs during the sample period, because the transmission-line impedance is much higher in this portion of the energy packet, allowing disturbances to be set up with less energy.

As previously summarized, the methods described herein can apply both prevention and detection methods to manage the practical operating aspects of digital electricity on transmission lines.

Figure 4:
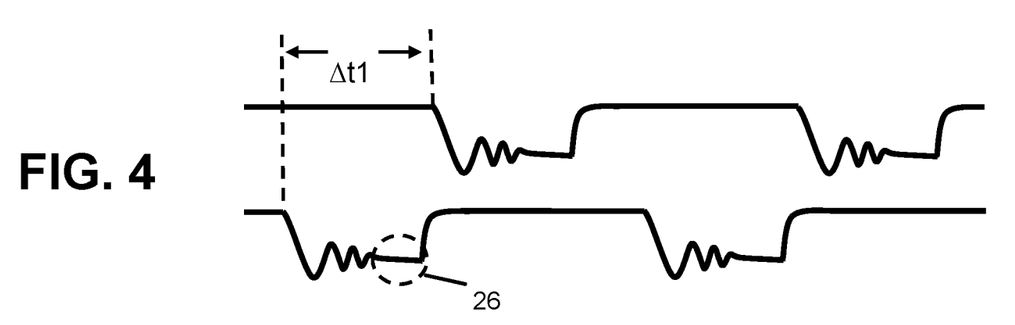
FIG. 4 illustrates interleaving of two PET voltage waveforms.
Figure 5:
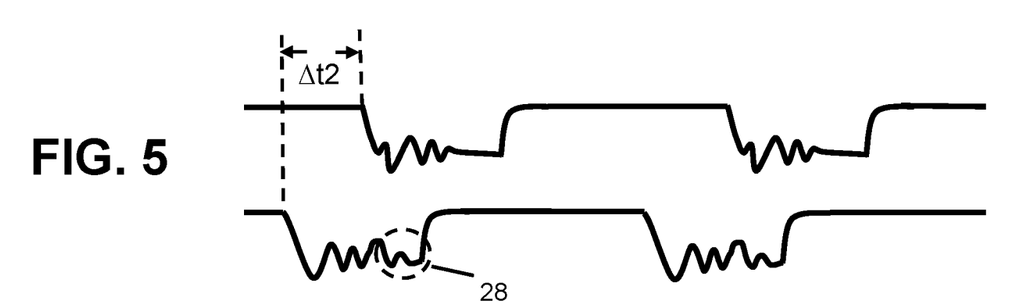
FIG. 5 illustrates how one PET waveform can induce noise on an adjacent waveform.

A method of preventing oscillation interference is illustrated in FIG. 4, where two adjacent digital electricity transmission line pairs are off-set, or interleaved, in time such that their sample periods do not occur simultaneously. This off-set allows the oscillations to diminish before the end of the sample period, as exemplified at point 26, allowing a valid measurement of line decay once the oscillation amplitude falls to an acceptable level. Without interleaving, the sample periods can overlap; and the electromagnetic emissions from the first line pair can extend the oscillations of the second, possibly until the oscillations consume the entire sample period as illustrated at point 28 of FIG. 5.

An acceptable, but less desirable, method to control line oscillations is to synchronize the energy packets of two transmission lines such that the sample periods start simultaneously. In this way, the line oscillations will occur and decay at approximately the same rate, allowing time later in the sample periods to make measurements when the oscillations have decayed to an acceptable level.

Figure 6:
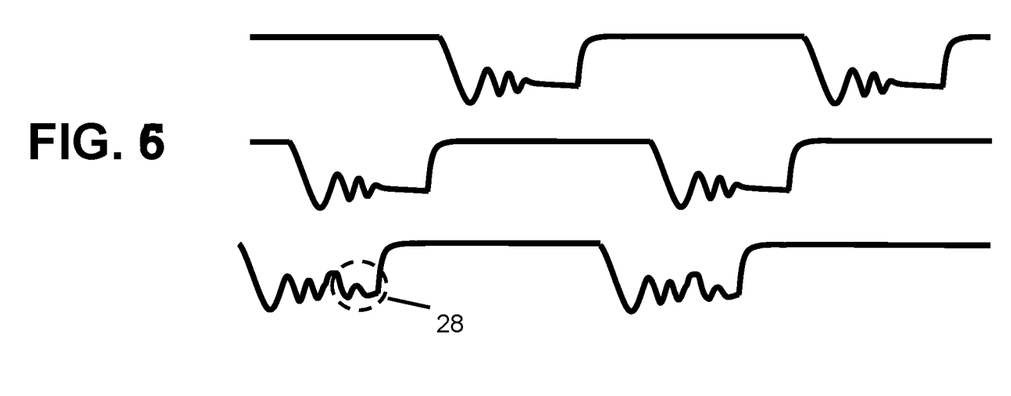
FIG. 6 illustrates the limitations in interleaving three PET waveforms.
Figure 7:
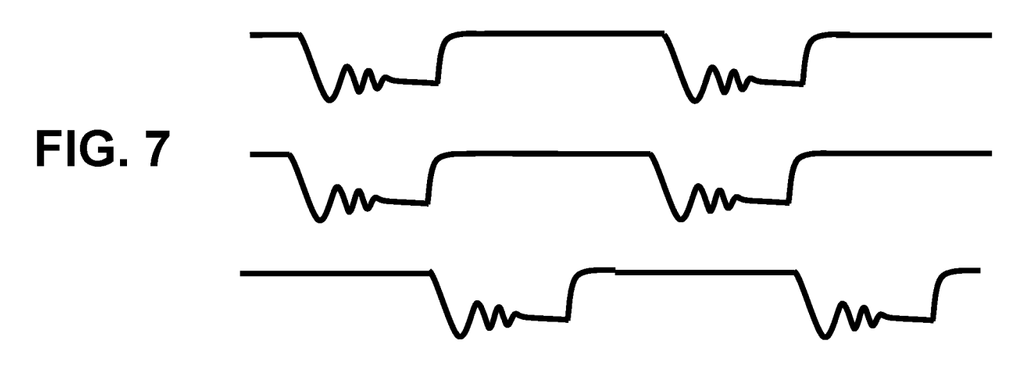
FIG. 7 illustrates combined interleaving and synchronization of three PET waveforms.

In practice, with large numbers of transmission line pairs, both synchronization and interleaving techniques can be employed, since, as the number of transmission line pairs increases, it becomes impossible to avoid overlap using interleaving techniques, alone. In the example of FIG. 6, it is not possible to offset more than the two transmission-line packets shown, since there would be no remaining sample periods in any of the three waveforms that would not be affected by the beginning of a sample period in another adjacent transmission line. The overlap would again extend the oscillation 28 during the sample period. To resolve this issue, the sample period for two of the transmission lines can be synchronized and the third can be off-set or interleaved, as illustrated in FIG. 7.

Figure 8:
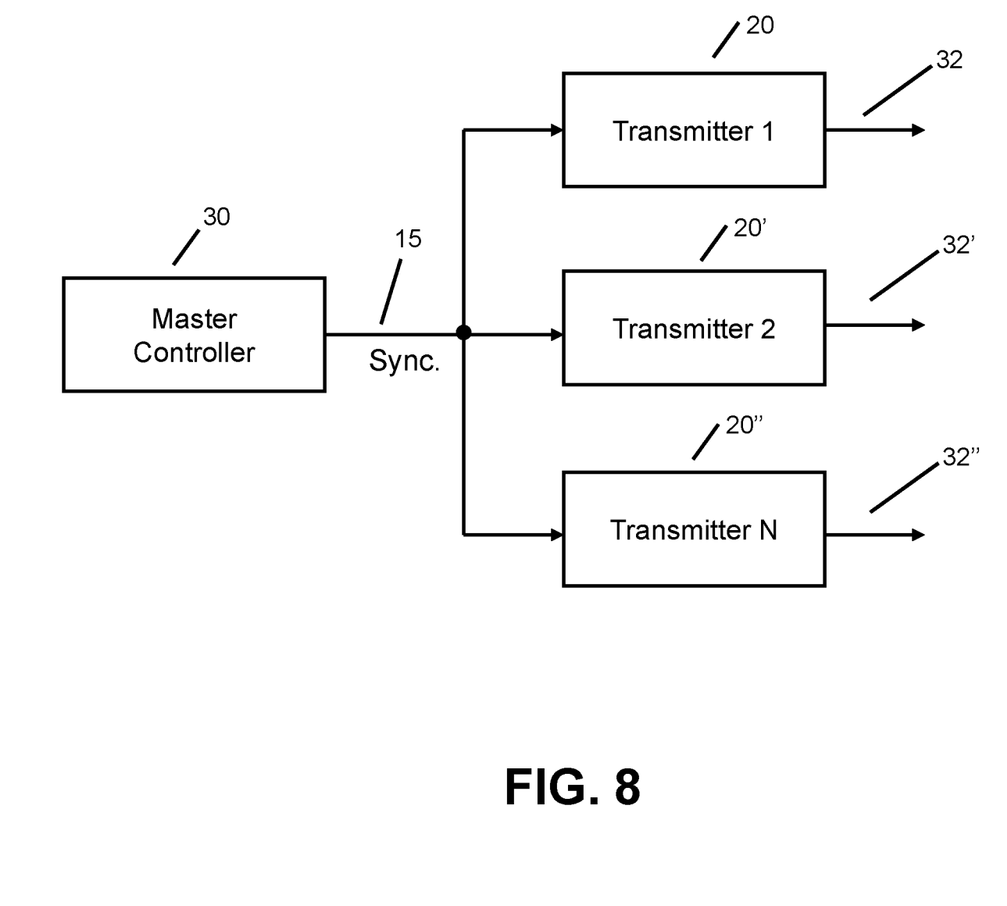
FIG. 8 is a block diagram of a PET system with synchronization signals.

Referring to FIG. 1, to facilitate the interleaving function, the transmitters of this embodiment incorporate a synchronization input to the source controller 18. Referring to FIG. 8, in a particular embodiment, a master controller 30 generates a synchronization signal that can be in the form of a pulse waveform or data element embedded in a serial communications stream. Each transmitter 20, 20', 20" holds an identifier in its individual controller that associates the controller to its respective transmission line 32, 32', 32". When the transmitter controller detects the synchronization pulse, it applies the appropriate offset to the start-time of the energy packet according to the sequential position of its transmission line among the transmission line group 32, 32', 32".

Figure 9:
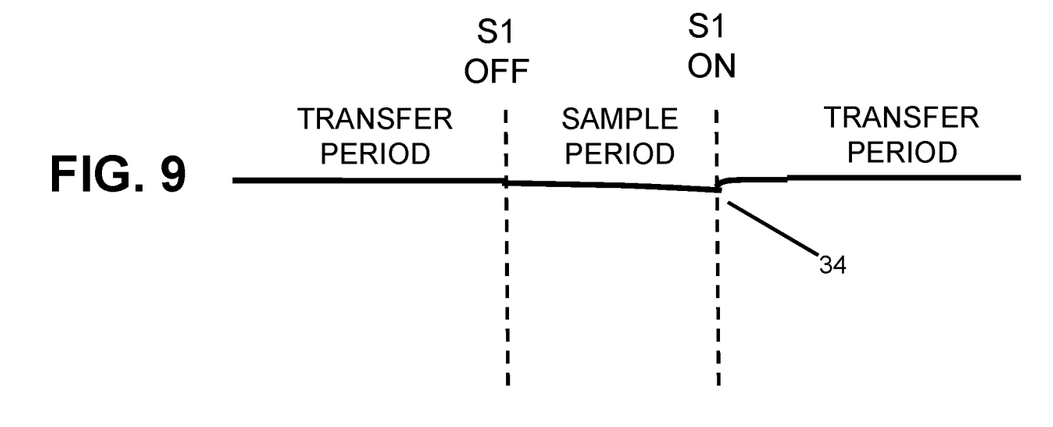
FIG. 9 illustrates the effects of high line capacitance in the PET waveform.

FIG. 9 illustrates a second consideration when performing measurements during the sample period. The decay of the transmission-line voltage during the sample period can be very small when the transmission-line capacitance is high versus lower-capacitance lines, as indicated by the decay in FIG. 9 at point 34. This makes line-to-line fault detection less sensitive, possibly leading to missing a fault condition.

FIG. 1 helps illustrate a first method for detecting high line capacitance and other line-to-line faults. Adding line bias provides additional current to charge or discharge the line capacitance. Source controller 18 acts to close solid-state switch (S3) 13 that connects resistor (R$_2$) 12 across the transmission-line conductors. This provides a negative bias to the transmission lines through the "pull-down" effect of R$_2$. Another bias circuit that provides a greater range of control of the bias voltage set-point can be created by simultaneously closing solid-state switch (S3) 13 and solid-state switch (S2) 11, which forms a voltage divider on the transmission line positive comprising resistor (R1) 10 and resistor (R2) 12.

The rate of voltage decay during the sample period with the bias applied is then compared to predetermined maximum and minimum values. If the rate of decay is too high or too low (i.e., above the predetermined maximum or below the predetermined minimum), the decay rate is indicative of a line fault. A fault because of high decay may be due to human contact or a foreign object placed across the transmission lines. A low decay fault may be due to excessive line capacitance or a hardware failure. The source controller 18 can then act to interrupt current to the transmission line by opening disconnect switch (S1) 3.

A second detection method involves determining if the voltage being measured on the transmission lines during the sample period is too noisy to support a valid measurement. Referred to as anomaly detection, the method quantifies the deviation of the transmission line voltage during the sample period from an ideal reference line. If the deviation exceeds a predetermined maximum, the measurement is considered invalid. After a predetermined number of invalid measurements, the line is considered to be in a faulted state; and power to the transmission line will be interrupted. The preferred method is to accumulate a series of voltage samples during the sample period and to compare the samples to a notional, non-vertical straight line using numerical regression, as illustrated in FIG. 3 by dotted line 24. The line represents the normal decay rate of the transmission lines if the lines were undisturbed by line reflections or electromagnetic interference (EMI). There are multiple methods for performing linear numerical regression well known to those skilled in the art. One method that can be employed in the current approach is the "least squares" method. If there is very little EMI or line oscillation, very little variance will exist between the notional line and the actual data samples since most data samples will fall very closely to the line. In instances of noisy or oscillating transmission lines, the variance or "residual" will be high; since many of the samples will fall far from the notional line. The coefficient of determination (r$^2$) commonly applied to linear regression is used to predict if the notional line can viably be used as a model for the underlying actual decay rate of the transmission lines during the sample period and is expressed as follows:

$$r^2 = Cov(x,y)^2 / [Var(x)^2 \cdot Var(y)^2],$$

where:
 r$^2$ is the coefficient of determination;
 x is the time of the sample relative to the start of the sample period;
 y is the voltage value of the sample taken at time x;
 Cov(x,y) is the covariance of x and y;
 Var(x) is the variance of x; and
 Var(y) is the variance of y.

The calculations for variance and covariance are well known to those skilled in the art of numerical regression. Low values of r$^2$ mean that the notional line is not a viable model for the underlying decay of the transmission-line voltage. If the value of r$^2$ falls below a predetermined value, a fault will be registered by the source controller; and the source controller will act to interrupt power to the transmission lines.

Summary, Ramifications and Scope:

The source controller 18 and load controller 19 can include a logic device, such as a microprocessor, microcontroller, programmable logic device or other suitable digital circuitry for executing the control algorithm. The load controller 19 may take the form of a simple sensor node that collects data relevant to the load side of the system and does not necessarily require a microprocessor.

The controllers 18 and 19 can be computing devices, and the systems and methods of this disclosure can be implemented in a computing system environment. Examples of well-known computing system environments and components thereof that may be suitable for use with the systems and methods include, but are not limited to, personal computers, server computers, hand-held or laptop devices, tablet devices, smart phones, multiprocessor systems, microprocessor-based systems, set top boxes, programmable consumer electronics, network PCs, minicomputers, mainframe computers, distributed computing environments that include any of the above systems or devices, and the like. Typical computing system environments and their operations and components are described in many existing patents (e.g., U.S. Pat. No. 7,191,467, owned by Microsoft Corp.).

The methods may be carried out via non-transitory computer-executable instructions, such as program modules. Generally, program modules include routines, programs, objects, components, data structures, and so forth, that perform particular tasks or implement particular types of data. The methods may also be practiced in distributed computing environments where tasks are performed by remote processing devices that are linked through a communications network. In a distributed computing environment, program modules may be located in both local and remote computer storage media including memory storage devices.

The processes and functions described herein can be non-transitorially stored in the form of software instructions in the computer. Components of the computer may include, but are not limited to, a computer processor, a computer storage medium serving as memory, and a system bus that couples various system components including the memory to the computer processor. The system bus can be of any of several types of bus structures including a memory bus or memory controller, a peripheral bus, and a local bus using any of a variety of bus architectures.

The computer typically includes one or more a variety of computer-readable media accessible by the processor and including both volatile and nonvolatile media and removable and non-removable media. By way of example, computer-readable media can comprise computer-storage media and communication media.

The computer storage media can store the software and data in a non-transitory state and includes both volatile and nonvolatile, removable and non-removable media implemented in any method or technology for storage of software and data, such as computer-readable instructions, data structures, program modules or other data. Computer-storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium that can be used to store the desired information and that can be accessed and executed by the processor.

The memory includes computer-storage media in the form of volatile and/or nonvolatile memory such as read only memory (ROM) and random access memory (RAM). A basic input/output system (BIOS), containing the basic routines that help to transfer information between elements within the computer, such as during start-up, is typically stored in the ROM. The RAM typically contains data and/or program modules that are immediately accessible to and/or presently being operated on by the processor.

The computer may also include other removable/non-removable, volatile/nonvolatile computer-storage media, such as (a) a hard disk drive that reads from or writes to non-removable, nonvolatile magnetic media; (b) a magnetic disk drive that reads from or writes to a removable, nonvolatile magnetic disk; and (c) an optical disk drive that reads from or writes to a removable, nonvolatile optical disk such as a CD ROM or other optical medium. The computer-storage medium can be coupled with the system bus by a communication interface, wherein the interface can include, e.g., electrically conductive wires and/or fiber-optic pathways for transmitting digital or optical signals between components. Other removable/non-removable, volatile/non-volatile computer storage media that can be used in the exemplary operating environment include magnetic tape cassettes, flash memory cards, digital versatile disks, digital video tape, solid state RAM, solid state ROM, and the like.

The drives and their associated computer-storage media provide storage of computer-readable instructions, data structures, program modules and other data for the computer. For example, a hard disk drive inside or external to the computer can store an operating system, application programs, and program data.

The synchronization signal to either synchronize or offset the PET waveforms described herein and illustrated in FIG. 6 can also be generated by one of the source controllers controlling transmission lines 32, 32', 32", thus eliminating the need for a separate master controller. The source controller producing the signal would become the master. There are several methods to determine which controller is the master. For example, the source controller with the lowest serial number can assume the master duties.

The bias circuit described herein can be constructed using an active power supply or operational amplifier circuit designed to drive the transmission-line voltage to a predetermined voltage setpoint. Although more complex than the simple voltage-divider circuit, an active device, such as an operational amplifier, is capable of driving the transmission-line voltage to the target setpoint more quickly than a resistive voltage divider.

An alternative method to construct a resistive voltage divider bias circuit is to employ a partially enhanced solid-state switch 3 (such as S1 of FIG. 1). If the switch (S1) 3 is embodied as a metal-oxide-semiconductor field-effect transistor (MOSFET), the device is partially enhanced by using a lower than normal gate drive voltage. In a partially enhanced state, the MOSFET performs like a resistor.

The linear regression method described herein for deriving a notional line of transmission-line decay can also be accomplished through analog-filtering circuitry or a digital-filtering algorithm. Linear regression is described in this specification due to the minimal processor resources necessary in the source controller to execute the algorithm. However, there are many numerical regression techniques that can be employed that are well known to those skilled in the art. These can be generally classified into linear, multi-linear and non-linear numerical regression.

In describing embodiments of the invention, specific terminology is used for the sake of clarity. For the purpose of description, specific terms are intended to at least include technical and functional equivalents that operate in a similar manner to accomplish a similar result. Additionally, in some instances where a particular embodiment of the invention includes a plurality of system elements or method steps, those elements or steps may be replaced with a single element or step. Likewise, a single element or step may be replaced with a plurality of elements or steps that serve the same purpose. Moreover, while this invention has been shown and described with references to particular embodiments thereof, those skilled in the art will understand that various substitutions and alterations in form and details may be made therein without departing from the scope of the invention. Further still, other aspects, functions, and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. The contents of references, including reference texts, journal articles, patents, patent applications, etc., cited throughout the text are hereby incorporated by reference in their entirety for all purposes; and all appropriate combinations of embodiments, features, characterizations, and methods from these references and the present disclosure may be included in embodiments of this invention. Still further, the components and steps identified in the Background section are integral to this disclosure and can be used in conjunction with or substituted for components and steps described elsewhere in the disclosure within the scope of the invention. In method claims (or where methods are elsewhere recited), where stages are recited in a particular order—with or without sequenced prefacing characters added for ease of reference—the stages are not to be interpreted as being temporally limited to the order in which they are recited unless otherwise specified or implied by the terms and phrasing.

What is claimed is:

1. A method for ensuring integrity of transmission-line voltage measurements in a digital-electricity power system comprising one or more transmitters, the method comprising:

with each transmitter, monitoring and controlling voltage of digital-electricity power transmission on a respective transmission line, wherein the digital-electricity power comprises energy packets; and ensuring integrity of transmission-line voltage measurements in the presence of line-voltage disturbances during a sample period by using a bias circuit distinct from transmission-line capacitance to apply a negative or positive bias to the transmission line during the sample period; acquiring voltage measurements with the bias applied; determining a rate of voltage change with the bias applied; and interrupting the transmission of digital-electricity power over the transmission line when the rate of voltage change is outside of predetermined minimum and maximum values, including interrupting the transmission of digital-electricity power over the transmission line when the rate of voltage change is below the predetermined minimum due to excessive line capacitance.

2. The method of claim 1, wherein the integrity of the transmission-line voltage measurements in the presence of line-voltage disturbances during the sample period is further ensured by acquiring at least three measurements of transmission-line voltage during the sample period where voltage measurements may be affected by electrical disturbances; performing numerical analysis on the voltage measurements to produce a polynomial function that approximates disturbance-free transmission-line voltage measurements; estimating accuracy of the polynomial function based on magnitude of variance of the individual voltage measurements from the approximation, and interrupting the transmission of digital-electricity power over the transmission line if the estimated accuracy does not meet a minimum accuracy requirement.

3. The method of claim 2, where the numerical analysis of the voltage measurements is a form of non-linear regression.

4. The method of claim 2, where the numerical analysis of the voltage measurements is a form of digital filtering.

5. The method of claim 2, where a signal indicative of the digital-electricity power is passed through an analog filtering circuit before the voltage of the digital-electricity power is measured for use in the numerical analysis.

6. The method of claim 1, where the bias is produced by an operational amplifier circuit.

7. The method of claim 1, where the bias is produced by a voltage-divider circuit.

8. The method of claim 7, where at least one resistance value in the voltage-divider circuit is produced by controlling the resistance of a transistor.

9. The method of claim 1, where the bias is produced by a power-supply circuit.

10. The method of claim 2, where the numerical analysis of the voltage measurements is a form of linear regression.

11. The method of claim 1, where the one or more transmitters comprise at least a first transmitter and a second transmitter, where the digital-electricity power system comprises at least a first and a second transmission line, where the first transmitter includes a controller that applies an off-set to a start time for transmission of energy packets on the first transmission line, where the second transmitter includes a controller that applies an off-set to a start time for transmission of energy packets on the second transmission line, and wherein the integrity of the transmission-line voltage measurements in the presence of line-voltage disturbances during the sample periods is further ensured by the off-sets applied by the controllers of the first and second transmitters shifting a start time of the sample period for voltage measurements on the first transmission line in reference to a sample period for voltage measurements on the second transmission line to reduce overlap of the sample periods across both transmission lines to prevent induction of electromagnetic noise from one transmission line to another transmission line.

12. The method of claim 1, where the one or more transmitters comprise at least a first transmitter and a second transmitter, where the first transmitter includes a controller that applies an off-set to a start time for transmission of energy packets on the first transmission line, where the second transmitter includes a controller that applies an off-set to a start time for transmission of energy packets on the second transmission line, and wherein the integrity of the transmission-line voltage measurements in the presence of line-voltage disturbances during the sample periods is further ensured by the off-sets applied by the controllers of the first and second transmitters synchronizing a start time of the sample period for voltage measurements on the first transmission line with a start time of the sample period for voltage measurements on the second transmission line to allow electromagnetic noise from both transmission lines to decay to a diminished value before the end of the sample periods, thus leaving at least part of the remaining sample periods available for disturbance-free voltage measurement.

* * * * *